(12) United States Patent
Kunemund

(10) Patent No.: US 6,946,878 B2
(45) Date of Patent: Sep. 20, 2005

(54) INTEGRATED CIRCUIT AND CIRCUIT ARRANGEMENT FOR CONVERTING A SINGLE-RAIL SIGNAL INTO A DUAL-RAIL SIGNAL

(75) Inventor: Thomas Kunemund, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/866,048

(22) Filed: Jun. 10, 2004

(65) Prior Publication Data

US 2004/0223383 A1 Nov. 11, 2004

Related U.S. Application Data

(63) Continuation of application No. PCT/DE02/04753, filed on Dec. 30, 2002.

(30) Foreign Application Priority Data

Jan. 24, 2002 (DE) .......................................... 102 02 725

(51) Int. Cl.[7] .......................................... H03K 19/096
(52) U.S. Cl. .............................. 326/98; 326/95; 326/93; 327/203; 327/201
(58) Field of Search .............................. 326/93, 95, 98; 327/201–203, 208–218, 224, 225

(56) References Cited

U.S. PATENT DOCUMENTS

| | | | |
|---|---|---|---|
| 4,149,099 A | | 4/1979 | Nagami |
| 4,435,791 A | | 3/1984 | Gingerich |
| 4,751,681 A | | 6/1988 | Hashimoto |
| 5,764,089 A | * | 6/1998 | Partovi et al. ............... 327/200 |
| 5,825,224 A | | 10/1998 | Klass |
| 5,920,218 A | * | 7/1999 | Klass et al. .................. 327/200 |
| 6,081,153 A | | 6/2000 | Hamada |
| 6,121,807 A | | 9/2000 | Klass |
| 6,222,404 B1 | * | 4/2001 | Mehta et al. ................ 327/200 |
| 6,236,240 B1 | | 5/2001 | Hill |

OTHER PUBLICATIONS

Patent Abstracts of Japan, vol. 005, No. 153, Sep. 26, 1981 & JP 56 086527 A (NEC CORP), Jul. 14, 1981, abstract.

* cited by examiner

Primary Examiner—Vibol Tan
(74) Attorney, Agent, or Firm—Darby & Darby

(57) ABSTRACT

An integrated circuit that converts a single rail signal into a dual-rail signal includes a clock signal connection, a data input to which a single-rail signal is applied, a data output on which a dual-rail signal is tapped off on output lines, and a converter, which is connected between the data input and the data output, that converts the single-rail signal into the dual-rail signal. The converter includes a memory cell having an input connected to the data input and output connections, wherein in a transparent state, the output connections provide the logically valid dual-rail signal, and a circuit arrangement, which is arranged between the output connections of the memory cell and the data output of the integrated circuit, that precharges the output lines connected to the output connections, and ensures a direct transition from a precharge phase to a logic state on the output lines, and vice versa.

16 Claims, 9 Drawing Sheets

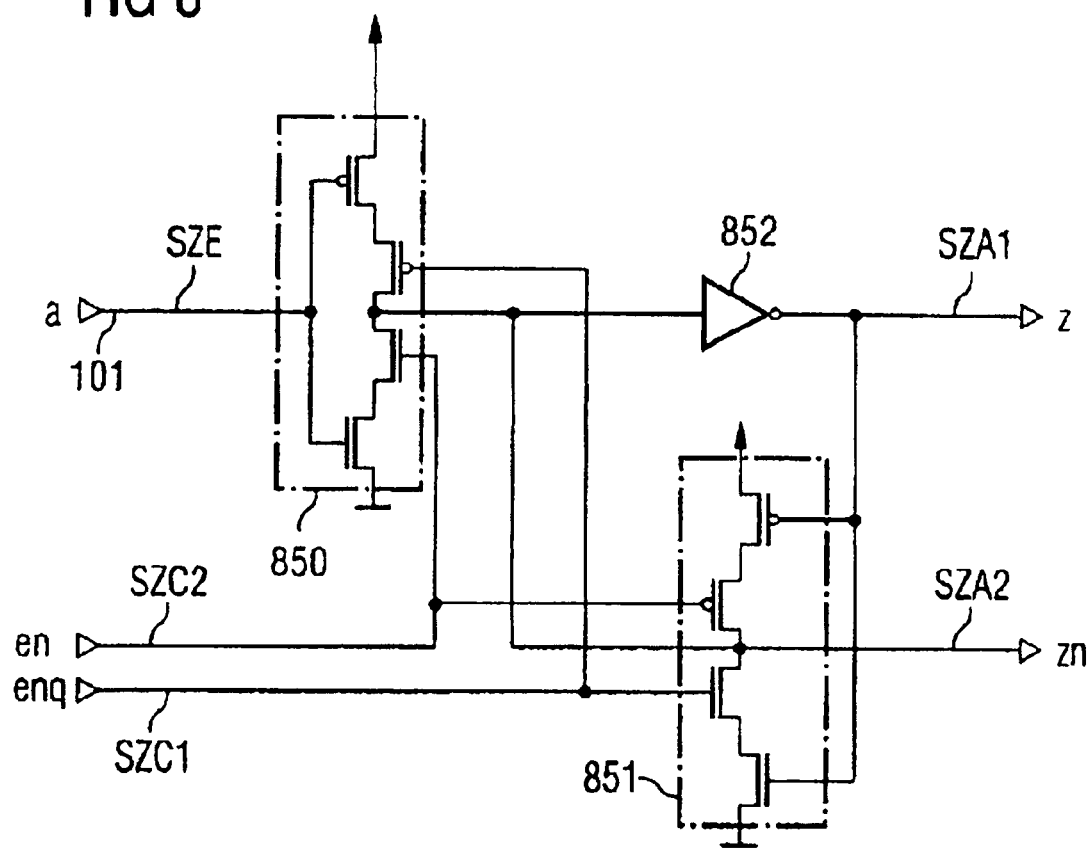

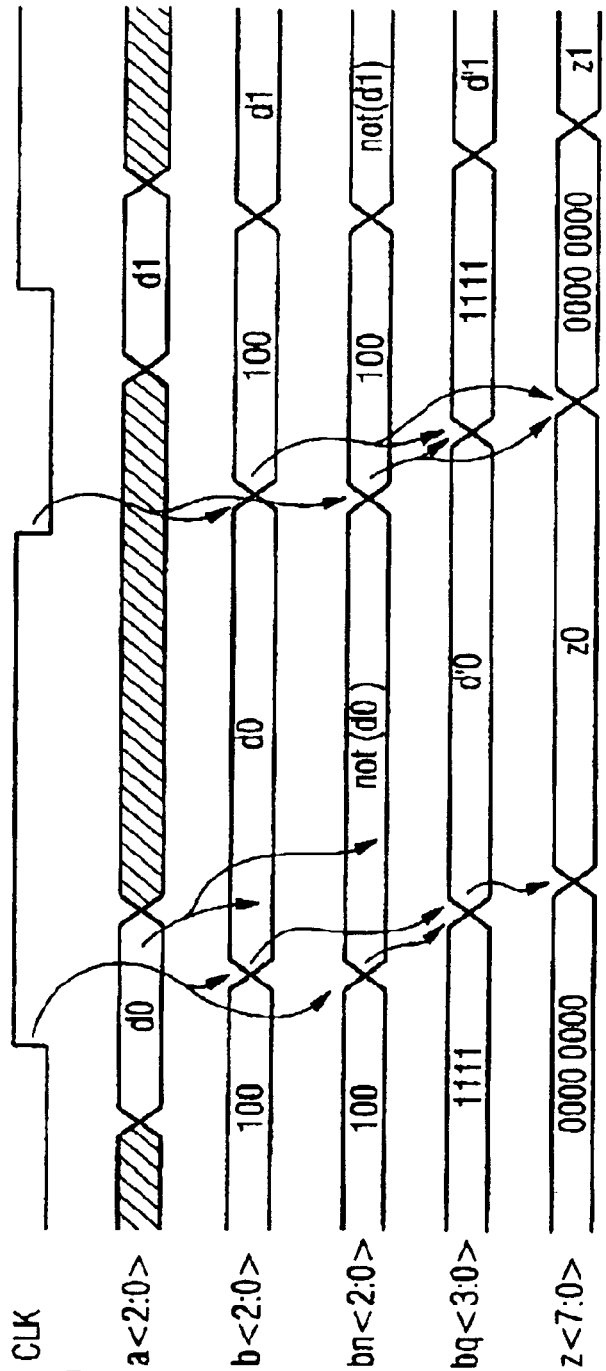

INTEGRATED CIRCUIT AND CIRCUIT ARRANGEMENT FOR CONVERTING A SINGLE-RAIL SIGNAL INTO A DUAL-RAIL SIGNAL

CROSS-REFERENCE TO RELATED APPLICATION

This application is a continuation of International Patent Application Serial No. PCT/DE02/04753, filed Dec. 30, 2002, which published in German on Jul. 31, 2003 as WO 03/063355, and is incorporated herein by reference in its entirety.

FIELD OF THE INVENTION

The invention relates to the circuitry of registers for data inputs in dual-rail logic switching circuits.

BACKGROUND OF THE INVENTION

Switching circuits, e.g. a 1-of-n decoder, are normally in microelectronic form. This means that each bit of a state stored in a register connected upstream of the switching circuit is physically represented by a single value at the register output. For the "single rail" circuitry, so-called for this reason, the same also applies for all the nodes within the switching circuits and for their inputs. The logic value of a state bit or its complementary value has a single corresponding electrical node. Switching circuits produced using single-rail technology can easily be spied out, however, e.g. using "differential power analysis".

Differential power analysis (DPA) is one of the most important methods for attacking chip cards for confidential information, such as passwords or cryptographic keys stored in the chip card. This involves using statistical methods in a prescribed program or in a prescribed algorithm to evaluate the measured current profiles or their charge integrals, calculated over one or more clock cycles, for the chip card. If the program is executed a sufficient number of times, the correlation between a systematic data variation and the respective charge integral can be used to draw conclusions about the information which is to be protected.

To make it more difficult to attack using differential power analysis, switching circuits can therefore be produced using "dual-rail" technology. In contrast to conventional single-rail logic, where each bit within a data or signal path is physically represented by a single electrical node in a switching circuit, an implementation using dual-rail logic involves each bit being represented by two nodes k and kq. The bit then has a valid logic value if k corresponds to the true logic value b of this bit and kq corresponds to the negated value bn=not (b).

The desired invariance in the charge integrals is achieved by virtue of two respective states with valid logic values (b, bn)=(1, 0) or (0, 1) having had a "precharge state" inserted between them for which both the node k and the node kq are charged to the same electrical potential. The nodes or signal lines consequently assume logically invalid values (1, 1) or (0, 0). For the precharge state (1, 1), a state sequence in a data or signal path containing the node k, kq might therefore have the following appearance:

(1, 1) (0, 1) (1, 1) (1, 0) (1, 1) (1, 0) (1, 1) (0, 1), . . .

For any of such state sequences, it holds true that any passage from a precharge state to a logically valid value involves a single node having its charge reversed from 1 to 0, and any passage from a logically valid value to a precharge state involves a single node having its charge reversed from 0 to 1. This is irrespective of the logically valid value b of a respective state bit.

It follows from this that the charge integrals corresponding to these state sequences are independent of the sequence of the logically valid values (b, bn), provided that it is ensured that the nodes k and kq have the same electrical capacitances. The current profile for a data path implemented in this way is thus not dependent on the variation in the data to be processed over time. Differential power analysis therefore does not succeed.

The text below describes how a dual-rail implementation is produced in the prior art, with reference to FIGS. 1 to 4.

FIG. 1 shows a block diagram with a switching circuit 200, which is in the form of a 1-of-n decoder, by way of example. The switching circuit is designed using dual-rail technology, which means that the data input on the switching circuit has two input connections 201, 202, to which the dual-rail signal b<2:0>, bn<2:0> can be applied, for each bit. Inside the switching circuit 200, the input signals are called a<2:0>, an<2:0>. The data input on the switching circuit 200 is preceded by a register 100 and an inverter 110 which converts a single-rail signal into a dual-rail signal and supplies this signal to the switching circuit 200. A data input 101 on the register 100 has a single-rail signal a<2:0> applied to it. The register 100 also has a clock signal connection 103 which has a clock signal CLK applied to it.

Upon every rising clock edge, the single-rail signal applied to the data input 101 is passed to the data output 102. The signal which can be tapped off there is referred to as z<2:0>. The conversion to a dual-rail signal is made by supplying the output signal z<2:0> once to the input connection 201 on the switching circuit 200 directly and once to the input connection 202 on the switching circuit 200 via an inverter 110. The data output 102 of the register 100 is thus connected to two output lines 104, 105, one of which is connected to the switching circuit 200 directly while the other is connected thereto via the inverter 110. The dual-rail signal is thus made up of the signals b<2:0> and bn<2:0>.

In the present exemplary embodiment in FIG. 1, it is assumed that the register 100 is a 3-bit register and that the switching circuit 200 is a 3-bit decoder. The chosen bit lengths are to be regarded merely by way of example. Both the register and the switching circuit could naturally have a different bit length. By way of example, the data output of the switching circuit 200 provides an 8-bit signal z<7:0>. The switching circuit also does not have to be a 1-of-8 decoder, as chosen in the present exemplary embodiment. Instead, the switching circuit can be of any type.

The register or the three registers 100 are, as illustrated in more detail in FIG. 3, in the form of master/slave registers, by way of example. Both the master, which is shown to the left of the dash-dot line, and the slave are in the form of "data latches" connected in push-pull configuration. The master data latch comprises a $C^2MOS$ switch 150 which is connected to a feedback inverter 151, which is likewise in the form of a $C^2MOS$ switch. The slave data latch is correspondingly designed using $C^2MOS$ switches and is connected downstream of the master data latch. Since the design of such a register has been known for a long time from the prior art, a more detailed description is omitted at this point.

The design of the 1-of-8 decoder from FIG. 1 is shown in FIG. 2. This figure clearly shows that the switching circuit 200 has a total of six input connections, with two input connections 201, 202 being provided for each bit. As already described for FIG. 1, the input connection 201 has the logically valid signal a<0>, a<1>, a<2> applied to it, while the input connection 202 has the respective complementary signal an<0>, an<1>, an<2> applied to it. Since the switching circuit 200 is a 1-of-8 decoder, it has a total of eight data outputs 203, each of which provides a signal z<0>, ..., z<7>. The circuit is implemented in a known manner using NAND gates 210 whose outputs are connected to the inputs of NOR gates 220. The signals provided at the outputs of the NAND gates 210 are referred to as bq<0>, ... bq<3>. Said design of the decoder is known from the prior art, which means that a detailed description is omitted at this point too.

An example of the timing of the signals shown in FIGS. 1 and 3 and of the clock signal CLK is shown in FIG. 4. Besides the clock signal CLK, the signal a<2:0> applied to the data input 101 on the register 100, the dual-rail signal b<2:0>, bn<2:0> supplied to the input connections 201, 202, the signal bq<3:0> produced by the NAND gates 210 and the signal z<7:0> which can be tapped off at the data output 203 of the switching network 200 are shown.

For this example, it is now assumed that the value "100" has been written to the 3-bit register 100 in the clock cycle before the first rising clock edge shown for the signal CLK in FIG. 4, which means that the following is initially true:

b<2:0>="100", bn<2:0>="011",
bq<3:0>="1110" and
z<7:0>="001 0000".

Upon the first rising edge of the clock signal CLK, the value a<2:0>="111" at the data input 101 is now taken into the register 100. This value is forwarded to the data output 102 of the register, so that initially the output line 104 and hence the input connection 201 have the signal b<2:0> applied to them, and the finite switching time of the inverter 110 means that the input connection 202 does not have the inverse signal thereof bn<2:0> applied to it until after that. Since the signal values are applied to the input connections 201, 202 at different times, the effect produced is that the intermediate signal bq<3:0> first changes from its initial value "1110" briefly to a logically invalid intermediate state "0000" before the stable final value "0111" is reached. This means that the data output 203 of the switching circuit 200 also briefly provides a logically invalid intermediate state: starting from a value z<7:0>="0001 0000", the logically invalid intermediate state "1111 0000" briefly appears before the stable final value "1000 0000" is reached.

Upon the second rising clock edge of the clock signal CLK, the value a<2:0>="111" is now reapplied to the data inputs 101 on the registers 100. As a result, the signals b<2:0>, bn<2:0>, bq<3:0> and z<7:0> change again.

This example reveals the drawback of the circuit arrangement used in the prior art: depending on the temporal shift in the signals b, bn applied to the input connections 201, 202, the data output 203 of the switching circuit 200 can briefly pass through logically invalid intermediate states, which can lead to faults or increased circuit complexity in circuit blocks connected downstream of the switching circuit 200. In addition, the superfluous signal changes associated with these intermediate states have the physical significance that the respective electrical capacitances need to have their charges reversed unnecessarily, which requires increased energy consumption. Furthermore, the current profile for the register and for the switching circuit is greatly dependent on the respective input data a (or a, an) which are to be processed, which means that the circuit arrangement is on the whole susceptible to differential power analysis despite the use of dual-rail technology.

SUMMARY OF THE INVENTION

An object of the present invention is therefore to specify an integrated circuit and a circuit arrangement for converting a single-rail signal into a dual-rail signal where the above drawbacks are easily avoided.

This object is achieved by an integrated circuit based on the features of the independent patent claim(s). Advantageous refinements can be found in the dependent claims.

The means for converting the single-rail signal into the dual-rail signal comprises a memory cell whose input is connected to the data input on the integrated circuit and to whose output, in the transparent state, the logically valid dual-rail signal is connected, with a circuit arrangement which is arranged between the output of the memory cell and the data output of the integrated circuit precharging the output lines and ensuring a direct passage from the precharge phase to the logic state on the output lines, and vice versa.

The invention avoids logically invalid intermediate states by virtue of the dual-rail signal not being able to be output to the data output directly after it has been produced. This is brought about by the circuit arrangement connected between the memory cell and the data output. This circuit arrangement firstly ensures that the output lines are precharged. In this case, precharging is always effected at the same clock state value (low or high). At the other clock state value (high or low), the precharging mechanism is then isolated from the data output and at the same time the dual-rail signal applied to the input on the circuit arrangement, i.e. the two output signals from the memory cell, are output directly to the data output, which comprises two output lines. The input connections of a switching circuit connected downstream of the inventive integrated circuit thus receive the logically valid signal and its complementary value simultaneously. This means that no logically invalid intermediate states can arise in the downstream switching mechanism.

Preferably, the output lines from the integrated circuit are precharged after each falling or rising clock edge of the clock signal. In other words, the precharging operation is effected whenever the clock signal is low or high. This results in a high level of performance from the integrated circuit.

In one development of the invention, provision is made for the clock signal to be supplied to a first clock signal input on the memory cell. In addition, provision is made for the inverted clock signal to be supplied to a second clock signal input on the memory cell. If the memory cell is in the form of a data latch, as provided in one preferred refinement, this data latch can be put into a transparent or latched state. In the transparent state, the signal applied to the data input is connected directly to the output of the data latch.

In one development, the circuit arrangement has a cascode voltage switch logic section (CVSL) whose input connections are connected to the output of the memory cell and whose output connections are the output lines from the integrated circuit. The cascode voltage switch logic section, which is known in principle from the prior art, ensures that the dual-rail signal applied to its input is provided distinctly at the data output of the inventive integrated circuit. This is understood to mean that none of the output lines can assume an undefined state between a high level or a low level.

To use the cascode voltage switch logic section to permit the output lines to be precharged, the circuit arrangement advantageously has a first and a second switching element whose control connections are respectively coupled to the clock signal and to the inverted clock signal and whose load paths are connected between a first or second supply potential connection and a respective one of the output lines, with the first and second switching elements being on in the transparent state of the memory cell.

If the memory cell is not in the transparent state, then the two switching elements are off and are actuated by the cascode voltage switch logic section, which is likewise coupled to the output lines, of course. This allows a direct passage to be made from the precharge state to the logic state on the output lines, and vice versa.

If a plurality of the inventive integrated circuits are provided in a circuit arrangement, then the input signal can be a plurality of bits long according to the number of integrated circuits.

BRIEF DESCRIPTION OF THE DRAWINGS

The invention and its advantages are described in more detail below with reference to the figures, in which:

FIG. 8 shows an exemplary embodiment of the circuitry of the memory cell from FIGS. 6 and 7; and FIGS. 9 and 9a shows the timing of the signals in the circuit arrangement from FIG. 5.

DETAILED DESCRIPTION OF A PREFERRED MODE OF THE INVENTION

Figure 5:
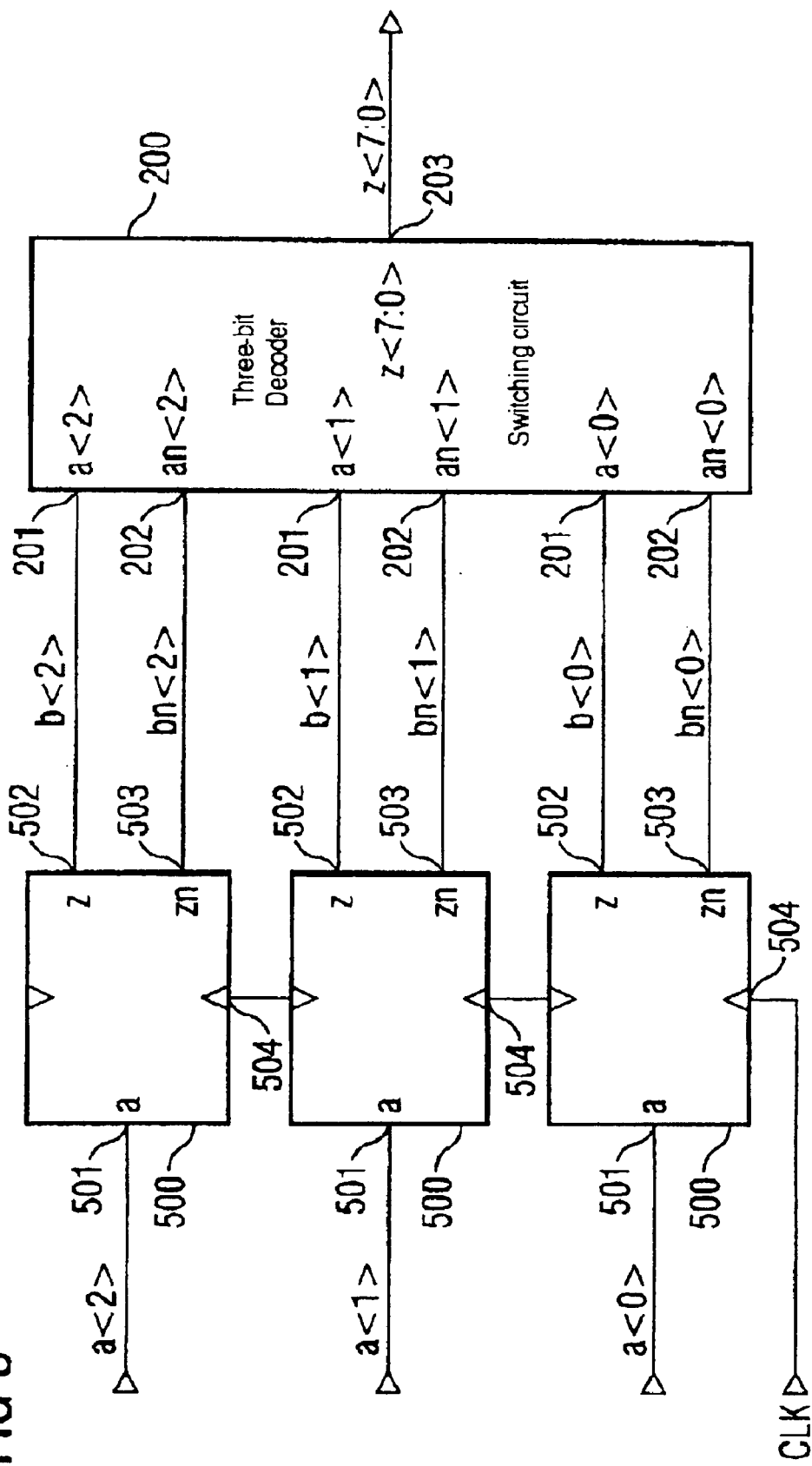
FIG. 5 shows the basic design of an inventive circuit arrangement with the downstream switching circuit.

FIG. 5 shows a block diagram of an inventive circuit arrangement having three registers 500. Each of the registers 500 has a data input 501 to which a signal a<0>, a<1>, a<2> is applied. Each of the registers has output connections 502, 503 which together form a data output for the register 500. While the data input 501 has a single-rail signal applied to it, the data output or the output connections 502, 503 provides or provide a dual-rail signal for tapping off which comprises the logically valid value b<0>, b<1>, b<2> and the respective complementary value bn<0>bn<1>, bn<2>. Each of the registers 500 has a clock signal connection 504 to which a clock signal CLK is applied.

Figure 1:
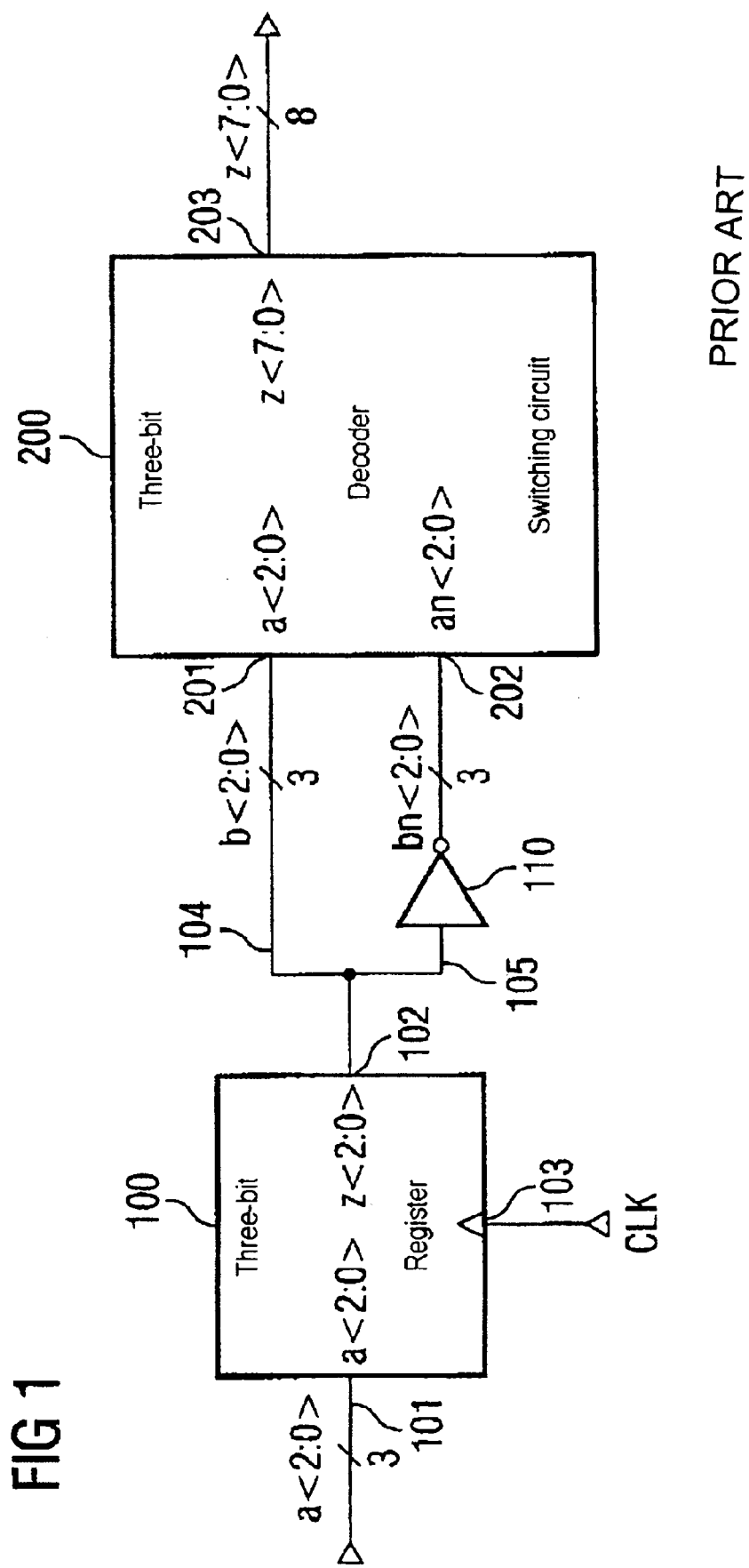
FIG. 1 shows a block diagram of an arrangement known from the prior art comprising a register and a downstream switching circuit.
Figure 2:
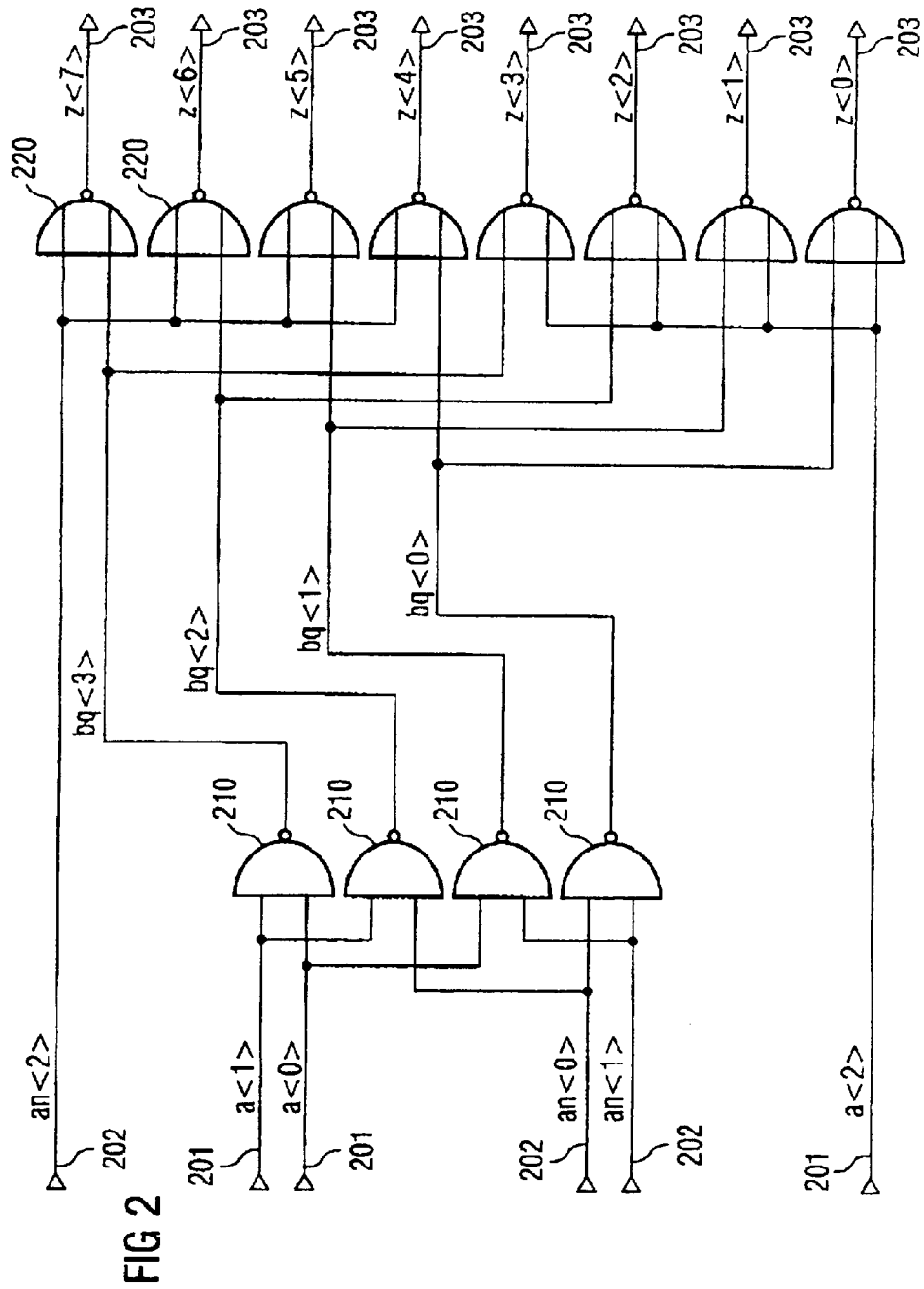
FIG. 2 shows the basic design of the switching circuit from FIG. 1 in the form of a 1-of-8 decoder.
Figure 3:
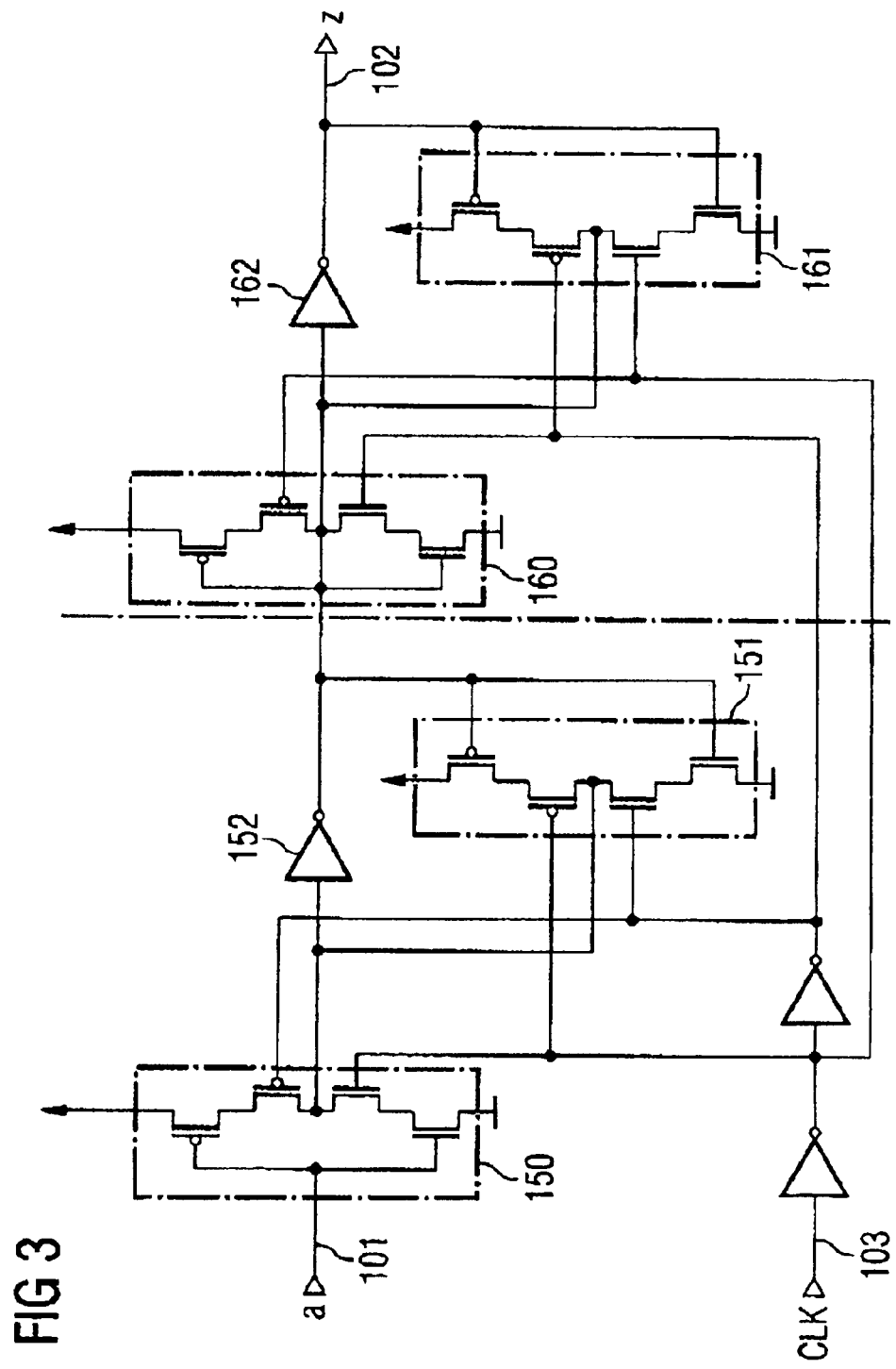
FIG. 3 shows a circuit implementation for the register shown in FIG. 1.
Figure 4:
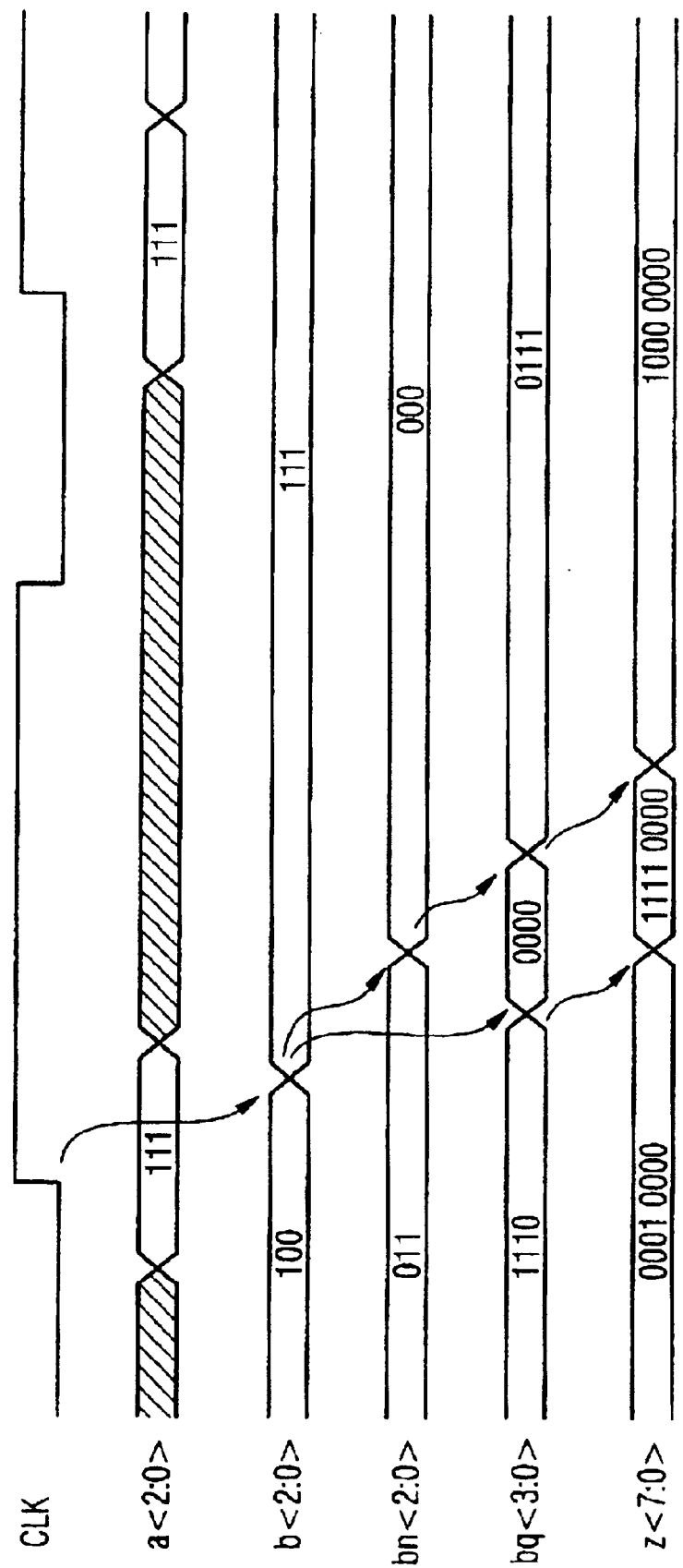
FIG. 4 shows the timing of the signals from FIG. 1.

The output connections 502, 503 of each register 500 are connected to input connections 201, 202 on a switching circuit 200. Merely by way of example, the switching circuit 200 is in the form of a 3-bit decoder switching circuit which is a 1-of-8 decoder. In principle, the design of the switching circuit could be arbitrary, however. This means that it could also be an n-bit decoder, so that a corresponding number n of registers 500 would need to be provided for each data input on the switching circuit 200. The circuit design of the switching circuit 200 is accordingly shown in FIG. 2.

Figure 6:
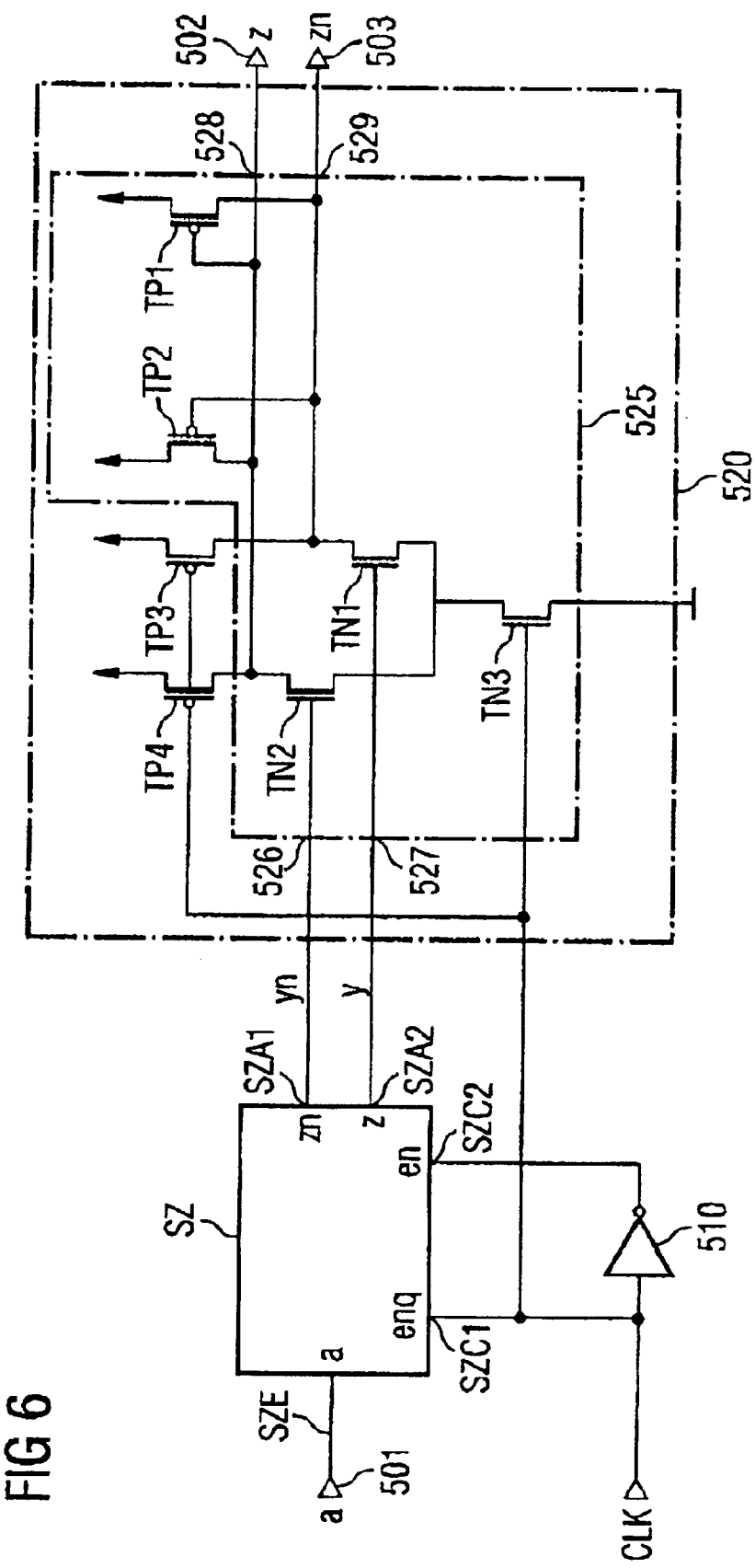
FIG. 6 shows a first exemplary embodiment of an inventive integrated circuit which can be used to precharge the output lines to the value (1, 1)
Figure 7:
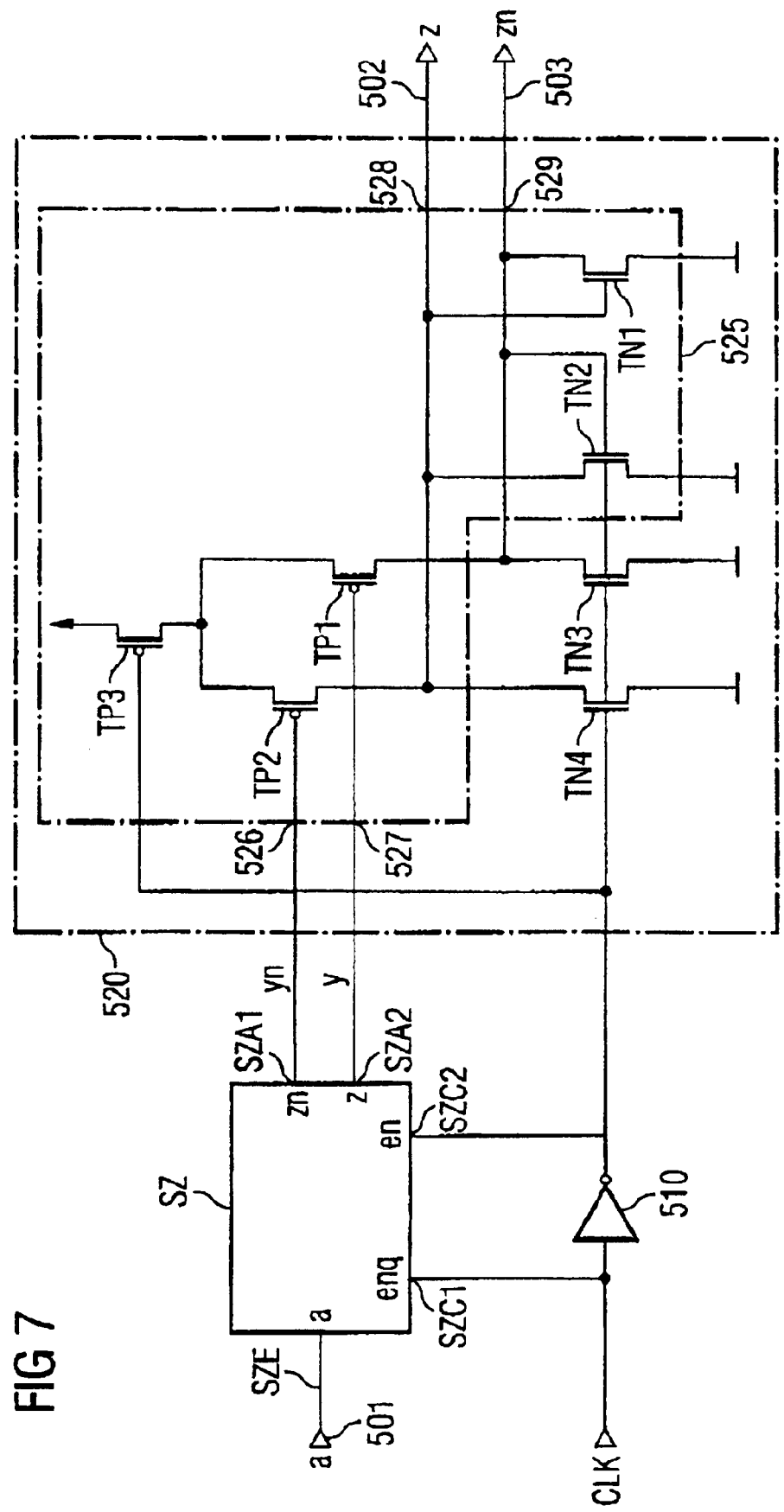
FIG. 7 shows a second exemplary embodiment of an inventive integrated circuit which can be used to precharge the output lines to (0, 0)

FIGS. 6 and 7 show, in first and second exemplary embodiments, the design of a register 500, that is to say of an integrated circuit for converting a single-rail signal into a dual-rail signal. The two exemplary embodiments have a basically similar design and differ in that the variant embodiment shown in FIG. 6 sets the output lines connected to the output connections 502, 503 to a precharge state (1, 1), while the exemplary embodiment shown in FIG. 7 provides a precharge state (0, 0).

The registers have a respective memory cell SZ which is in the form of a data latch. The input SZE on the data latch is connected to the data input 501 on the register. The data latch SZ has two output connections SZA1, SZA2 which provide the dual-rail signal zn, z or yn, y in the transparent state. The data latch also has a first clock signal input SZCI, to which the clock signal CLK is applied, and a second clock signal input SZCZ, to which the inverted clock signal CLK is applied.

To allow the dual-rail signal y, yn to be forwarded without delay to the output connections 502, 503 and hence to the input connections 201, 202 of a downstream switching circuit (FIG. 5) after a precharge state, the circuit arrangement 520 is provided.

In both variant embodiments, the circuit arrangement 520 comprises a cascode voltage switch logic section 525 and first and second switching elements TP3, TP4 (FIG. 6) and TN3, TN4 (FIG. 7).

The embodiment described up to now is identical in both variants of the inventive register. In the text below, the circuit arrangement 520 is described initially with reference to FIG. 6, which differs from the one from FIG. 7.

As already mentioned in the introduction, the integrated circuit shown in FIG. 6 produces a precharge state (1, 1) on the output lines connected to the output connections 502, 503. To this end, the output connections 502, 503 can be connected to a supply potential VDD via the second switching element TP3 and the first switching element TP4. The first and second switching elements TP3, TP4 are in the form of P-channel transistors. The control connections thereof each have the clock signal CLK applied to them. This means that the output connections 502, 503 are always precharged to (1, 1) when the clock signal CLK is low.

The cascode voltage switch logic section 525, comprising the N-channel transistors TN1, TN2, TN3 and the P-channel transistors TP1, TP2, ensures that, upon the rising edge of the clock signal CLK, the signals y, yn which can be tapped off at the output connections SZA1, SZA2 of the data latch SZ are forwarded to the output connections 502, 503. While the clock signal CLK is high, the data latch is latched and thus keeps the signal value y, yn.

As soon as the clock signal CLK assumes the value 1 (corresponding to high), the first and second switching elements TP3, TP4 are turned off. At the same time, the transistor TN3 connects the transistors TN1, TN2 to the reference-ground potential VSS. The control connection on the transistor TN1 has the logically valid signal y applied to it, while the control connection on the n-channel transistor TN2 has the complementary signal yn applied to it. The value 0 (corresponding to low) is thus provided on one of the output connections 502, 502, since there is a direct connection to the reference-ground potential VSS via TN2, TN3 or TN1, TN3. That transistor among the P-channel transistors TP1, TP2 whose control connection is connected to this output connection 502, 503 then connects the other output connection 502, 503 to the supply potential VDD. The transistors TP1, TP2 thus ensure that the output connections 502, 503 provide distinct signals z, zn.

If the clock signal CLK has the logic value 0, the data latch SZ is transparent, that is to say there is a direct connection between the data input SZE and the output connections SZA1, SZA2. At the same time, the output connections 502, 503 are precharged to 1 via the first and second switching elements TP3, TP4.

The way in which the second variant embodiment, as shown in FIG. 7, works and the design thereof are similar. In this case too, the data latch SZ is transparent when the clock signal CLK=0. The lines connected to the output connections 502, 503 are precharged to (0, 0) via the N-channel transistors TN3, TN4, whose control connections have the inverted clock signal applied to them. The P-channel-transistor TP3, which is part of the cascode voltage switch logic section, is off for CLK=0, which means that the dual-rail signal y, yn provided at the data outputs SZA1, SZA2 cannot be routed to the output connections 502, 503 of the register.

Accordingly, this is only possible as soon as the clock signal CLK assumes a rising edge. When the clock signal assumes the logic value 1, the first and second switching elements TN3, TN4 are turned off. The transistor TP3 connects the P-channel transistors TP1, TP2 to supply potential VDD. These, for their part, have the signals y, yn applied to their control inputs. The N-channel transistors TN1, TN2 are in turn used to produce complementary signals at the output connections 502, 503.

Both variants have the assurance that the dual-rail signal is provided on the output connections 502, 503 at the same time, so that a downstream switching mechanism cannot have any logically invalid intermediate states.

The timing of the signals and of the clock signal CLK in the circuit arrangement from FIG. 5 is shown in FIG. 9. The signal a<2:0> is applied to the data input 501 on the register 500. The signal b<2:0> can be taken from the output connection 502, and the signal bn<2:0> is provided on the output connection 503. These signals are thus supplied to the input connections 201, 202 of a downstream switching circuit (cf. FIG. 5). The signal bq<3:0> is the output signal from the NAND gates which has already been explained in FIG. 2. This is thus a signal which appears inside the switching circuit 200. Finally, z<7:0> denotes the output signal from the switching mechanism 200.

For CLK=0, the signals b<2>, bn<2> and b<1:0>, bn<1:0> from each data latch SZ are provided on the output connections 502, 503 are in their precharge states (1, 1) and (00, 00). This is because the top register 500 shown in FIG. 5 is designed in line with FIG. 6, while the two other registers 500 are designed in line with FIG. 7. This assumption is just one example. In principle, the registers 500 can be used in line with FIG. 6 or in line with FIG. 7 as desired. The only crucial matter is which precharge state needs to be applied to the inputs of a switching circuit.

In line with the way in which the registers 500 work, as described above, the signals bq<3:0> and z<7:0> are also in their precharge states "1111" and "0000 0000" when the clock signal CLK=0. Upon the rising edge of the clock signal CLK, the dual-rail signal y, yn on the output connections SZA1, SZA2 is forwarded to the output connections 502, 503 of the register 500. The signals applied to the data inputs 501 are denoted by "d" in FIG. 9, with the values which d can assume being indicated in the table shown in FIG. 9a. According to the principle of dual-rail technology, the signal d is likewise provided on the output connection 502 a short time after a rising clock edge CLK. At the same instant, the signal bn<2:0>=not(d) is supplied to the output connection 503. Since the correct signals are thus applied to the input connections 201, 202 of the switching circuit 200 at the same time, the switching circuit can pass from a precharge state directly to the logically valid state d'. The same then applies to the data output 203, which likewise changes directly to its logically valid value corresponding to the register outputs.

The inventive integrated circuit or circuit arrangement thus prevents faults, or increased circuit complexity for equalizing delayed input signals, in downstream circuits. In addition, superfluous signal changes are avoided. In physical terms, this means that the respective electrical capacitances never have their charges reversed unnecessarily, which ensures low energy consumption. In addition, the current profile for the switching circuit is not dependent on the respective data which are to be processed, which means that these circuits are resistant to attacks using differential power analysis.

FIG. 8 shows, by way of example, the design of a data latch. This data latch comprises two $C^2MOS$ switches 850, 851, with the $C^2MOS$ switch 851 being used as a feedback inverter. The basic design of such a data latch is known, which means that a more detailed description is omitted. Aside from this, FIG. 8 shows just one exemplary embodiment, which could also have a different design.

What is claimed is:

1. An integrated circuit for converting a single-rail signal into a dual-rail signal, comprising:

a clock signal connection for a clock signal;

a data input having an input line to which a single-rail signal is applied;

a data output on which a dual-rail signal is tapped off on output lines; and a converter, which is connected between the data input and the data output, that converts the single-rail signal into the dual-rail signal, wherein the converter comprises:

a memory cell having an input connection connected to the data input on the integrated circuit and output connections, wherein in a transparent state, the output connections provide the dual-rail signal, which is logically valid; and a circuit arrangement, which is arranged between the output connections of the memory cell and the data output of the integrated circuit, that precharges the output lines connected to the output connections, and ensures a direct transition from a precharge phase to a logic state on the output lines, and vice versa.

2. The integrated circuit as claimed in claim 1, wherein the output lines connected to the output connections are precharged after each falling or rising clock edge of the clock signal.

3. The integrated circuit as claimed in claim 1, wherein the clock signal is supplied to a first clock signal input on the memory cell.

4. The integrated circuit as claimed in claim 1, wherein the circuit arrangement has a cascode voltage switch logic section whose input connections are connected to the output connections of the memory cell and whose output connections are the output lines of the integrated circuit.

5. The integrated circuit as claimed in claim 4, wherein the circuit arrangement has a first and a second switching element whose control connections are respectively coupled to the clock signal and whose load paths are connected between a first supply potential connection and a respective one of the output lines connected to the output connections, with the first and second switching elements being in the transparent state of the memory cell.

6. The integrated circuit as claimed in claim 4, wherein the circuit arrangement has a first and a second switching element whose control connections are respectively coupled to the inverted clock signal and whose load paths are connected between a second supply potential connection and a respective one of the output lines connected to the output connections, with the first and second switching elements being in the transparent state of the memory cell.

7. The integrated circuit as claimed in claim 1, wherein the memory cell is a data latch.

8. A circuit arrangement having a plurality of integrated circuits as claimed in claim 1.

9. A circuit arrangement having a plurality of integrated circuits as claimed in claim 2.

10. A circuit arrangement having a plurality of integrated circuits as claimed in claim 3.

11. A circuit arrangement having a plurality of integrated circuits as claimed in claim 4.

12. A circuit arrangement having a plurality of integrated circuits as claimed in claim 5.

13. A circuit arrangement having a plurality of integrated circuits as claimed in claim 6.

14. A circuit arrangement having a plurality of integrated circuits as claimed in claim 7.

15. An integrated circuit for converting a single-rail signal into a dual-rail signal, comprising:

a clock signal connection for a clock signal;

a data input having an input line to which a single-rail signal is applied;

a data output on which a dual-rail signal is tapped off on output lines; and a converter, which is connected between the data input and the data output, that converts the single-rail signal into the dual-rail signal, wherein the converter comprises:

a memory cell having an input connection connected to the data input on the integrated circuit and output connections, wherein in a transparent state, the output connections provide the dual-rail signal, which is logically valid, and wherein an inverted data clock signal is supplied to a second clock signal input on the memory cell; and a circuit arrangement, which is arranged between the output connections of the memory cell and the data output of the integrated circuit, that precharges the output lines connected to the output connections, and ensures a direct transition from a precharge phase to a logic state on the output lines, and vice versa.

16. A plurality of integrated circuits, wherein each of said integrated circuits converts a single-rail signal into a dual-rail signal, each of said integrated circuits comprising:

a clock signal connection for a clock signal;

a data input having an input line to which a single-rail signal is applied;

a data output on which a dual-rail signal is tapped off on output lines; and a converter, which is connected between the data input and the data output, that converts the single-rail signal into the dual-rail signal, wherein the converter comprises:

a memory cell having an input connection connected to the data input on the integrated circuit and output connections, wherein in a transparent state, the output connections provide the dual-rail signal, which is logically valid, and wherein an inverted data clock signal is supplied to a second clock signal input on the memory cell; and a circuit arrangement, which is arranged between the output connections of the memory cell and the data output of the integrated circuit, that precharges the output lines connected to the output connections, and ensures a direct transition from a precharge phase to a logic state on the output lines, and vice versa.

* * * * *